US011211197B2

(12) United States Patent
Jankowski

(10) Patent No.: US 11,211,197 B2
(45) Date of Patent: Dec. 28, 2021

(54) INDUCTIVE CURRENT TRANSFORMER FOR TRANSMITTING INFORMATION USING CURRENT MODULATION

(71) Applicant: Phoenix Contact GmbH & Co. KG, Blomberg (DE)

(72) Inventor: Martin Jankowski, Seelze (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 617 days.

(21) Appl. No.: 15/778,553

(22) PCT Filed: Nov. 23, 2016

(86) PCT No.: PCT/EP2016/078568
§ 371 (c)(1),
(2) Date: May 23, 2018

(87) PCT Pub. No.: WO2017/089407
PCT Pub. Date: Jun. 1, 2017

(65) Prior Publication Data
US 2018/0350517 A1    Dec. 6, 2018

(30) Foreign Application Priority Data
Nov. 24, 2015    (DE) .......................... 102015120319.7

(51) Int. Cl.
*H01F 38/30*    (2006.01)
*G01R 15/18*    (2006.01)
(Continued)

(52) U.S. Cl.
CPC ............. *H01F 38/30* (2013.01); *G01R 15/18* (2013.01); *G01R 15/183* (2013.01);
(Continued)

(58) Field of Classification Search
CPC .......... H01F 38/30; H01F 27/29; H01F 38/14; H01F 2038/146; H01F 2038/305;
(Continued)

(56) References Cited

U.S. PATENT DOCUMENTS 6,470,283 B1 * 10/2002 Edel ................... G01R 19/2513
324/72.5
9,766,273 B2 * 9/2017 Nguyen ............... G01R 15/146
(Continued)

FOREIGN PATENT DOCUMENTS

CN    202931032 U    5/2013
CN    101950659 A    1/2019
(Continued)

OTHER PUBLICATIONS

Office Action issued in counterpart Chinese patent application No. 201680068440.8, dated Jan. 17, 2020, 14 pp.
(Continued)

*Primary Examiner* — Tung X Nguyen
*Assistant Examiner* — Feba Pothen
(74) *Attorney, Agent, or Firm* — Kaplan Breyer Schwarz, LLP

(57) ABSTRACT

An inductive current transformer for transforming a primary current into a secondary current, has a secondary winding with two terminals, an electronic device for transmitting information to an external measuring device, a first inductive coupling device connected to the secondary winding, and a power supply device which is coupled to the secondary winding via the first inductive coupling device and which is adapted to generate a supply voltage for the electronic device from the secondary electric current of the secondary winding.

9 Claims, 3 Drawing Sheets

(51) Int. Cl.
*G01R 19/00* (2006.01)
*H01F 27/29* (2006.01)
*H01F 38/14* (2006.01)
*G01R 22/06* (2006.01)

(52) U.S. Cl.
CPC ....... *G01R 19/0092* (2013.01); *G01R 22/063* (2013.01); *H01F 27/29* (2013.01); *H01F 38/14* (2013.01); *H01F 2038/146* (2013.01); *H01F 2038/305* (2013.01)

(58) Field of Classification Search
CPC .. G01R 15/18; G01R 15/183; G01R 19/0092; G01R 22/063
See application file for complete search history.

(56) References Cited

U.S. PATENT DOCUMENTS

| | | | | |
|---|---|---|---|---|
| 2009/0315536 | A1* | 12/2009 | Koch | G01R 19/20 324/117 R |
| 2010/0023283 | A1* | 1/2010 | Boutorabi | G01R 19/2513 702/60 |
| 2010/0264906 | A1* | 10/2010 | Shamir | G01R 15/183 324/127 |
| 2016/0124024 | A1* | 5/2016 | Jefferies | G01R 15/183 324/127 |

FOREIGN PATENT DOCUMENTS

| | | |
|---|---|---|
| DE | 251850 A1 | 11/1987 |
| DE | 3615463 A1 | 11/1987 |
| DE | 29521924 U1 | 11/1995 |
| DE | 102010012834 A1 | 9/2011 |
| DE | 112010001638 T5 | 6/2012 |
| EP | 2369353 A2 | 9/2011 |
| WO | 2015025332 A2 | 2/2015 |

OTHER PUBLICATIONS

Officer Krisi Luukkonen, International Search Report and the Written Opinion, International Patent Application PCT/EP2016/078568, dated Jan. 25, 2017, 11 pp.

German Office Action issued in Related German Patent Application 10 2015 120 319.7, dated Sep. 7, 2016, 9 pp.

* cited by examiner

INDUCTIVE CURRENT TRANSFORMER FOR TRANSMITTING INFORMATION USING CURRENT MODULATION

FIELD

The invention relates to an inductive current transformer for transforming a primary electric current to be measured into a secondary electric current, and also relates to a measuring arrangement comprising such an inductive current transformer.

BACKGROUND

In process automation it is known, for example, to use current transformers to monitor high currents, e.g. 200 A.

From DE 36 15 463 A1, an arrangement for signal transmission in a measuring arrangement is known, comprising a measuring transformer and an evaluation device located remotely therefrom. The measuring transformer is connected to the evaluation device by a two-wire line that is used, on the one hand, for transmitting the DC voltage required for the operation of the measuring transformer from the evaluation device to the measuring transformer, and on the other hand for transmitting the measurement value signal representing the measured parameter from the measuring transformer to the evaluation device.

From DE 29 521 924 A1 a device is known for generating and processing measurement signals, comprising a sensor with a measuring transformer and an evaluation unit remote from the sensor for evaluating the measurement signal of the sensor. The sensor can be connected to the evaluation unit via a data transmission line which can be used for transmitting characteristic data of the sensor, inter alia.

SUMMARY

An object of the present invention is to provide an inductive current transformer which has internal electronics that can be supplied with power independently of an external device.

What can be considered as a key idea of the invention is that an inductive current transformer itself is capable of powering integrated electronics from its secondary circuit, and of transmitting data via the secondary current lines connected to the secondary winding, through current modulation.

The problem mentioned above is solved by the features of claim 1 on the one hand.

Accordingly, an inductive current transformer is provided for transforming a primary electric current to be measured into a secondary electric current. The inductive current transformer may, for example, be a plug-in current transformer. The inductive current transformer has a secondary winding with two terminals. Furthermore, an electronic device is integrated in the inductive current transformer, which is adapted to transmit information to an external measuring device.

The information may include characteristic data of the inductive current transformer, which can preferably be stored in a memory of the electronic device.

Furthermore, the inductive current transformer comprises an inductive coupling device which is connected to the secondary winding. An internal power supply device is coupled to the secondary winding via the coupling device and is adapted to generate a supply voltage for the electronic device from the secondary electric current of the secondary winding.

According to an advantageous embodiment, the inductive current transformer may comprise two connecting conductors, each of which is connected to a respective one of the terminals of the secondary winding. The coupling device is preferably implemented as a current transformer having first and second windings, wherein one of the connecting conductors forms the first winding of the current transformer and the second winding is connected to the internal power supply device.

Appropriately, the electronic device is adapted to selectively modulate the secondary current of the secondary winding in order to be able to transmit information, preferably characteristic data.

In order to allow for reliable operation, the carrier frequency of the information carrying signal should be significantly higher than the harmonics of the electrical primary current to be measured, so that the secondary current which represents the actual measurement signal is not corrupted by the modulated signal.

In order to be able to convey information via the secondary current, the electronic device may appropriately be coupled to the secondary winding via the first inductive coupling device, or via a second inductive coupling device, or via a capacitive coupling device, in order to be able to selectively modulate the secondary current.

According to an advantageous embodiment it is contemplated that the electronic device of the inductive current transformer comprises a measuring device for measuring the secondary current, a measuring device for measuring a secondary voltage applied to the terminals of the secondary winding, and a device for calculating the electrical power as a function of the secondary current and of the secondary voltage.

In this case, the electronic device may be adapted to detect, in response to a calculated electrical power, the exceeding of a predefined rated power, and to signal this condition to a measuring device through a modulation of the secondary current. For this purpose, the electronic device may include a microcontroller as a control unit.

In order to make the inductive current transformer even more smart, the electronic device may include a temperature sensor, and the electronic device may be adapted to transmit temperature values as determined by the temperature sensor to the external measuring device, through a modulation of the secondary current.

The technical problem mentioned above is also solved by the features of claim 10.

Accordingly, a measuring arrangement is provided which comprises an inductive current transformer as described above, and a measuring device that is connected to the inductive current transformer via a connection line.

In order to be able to demodulate and evaluate the secondary current modulated by the inductive current transformer, the measuring device includes appropriate means for demodulating and evaluating.

BRIEF DESCRIPTION OF THE DRAWINGS

The invention will now be explained in more detail by way of some exemplary embodiments in conjunction with the accompanying drawings, wherein.

DETAILED DESCRIPTION

Figure 1:
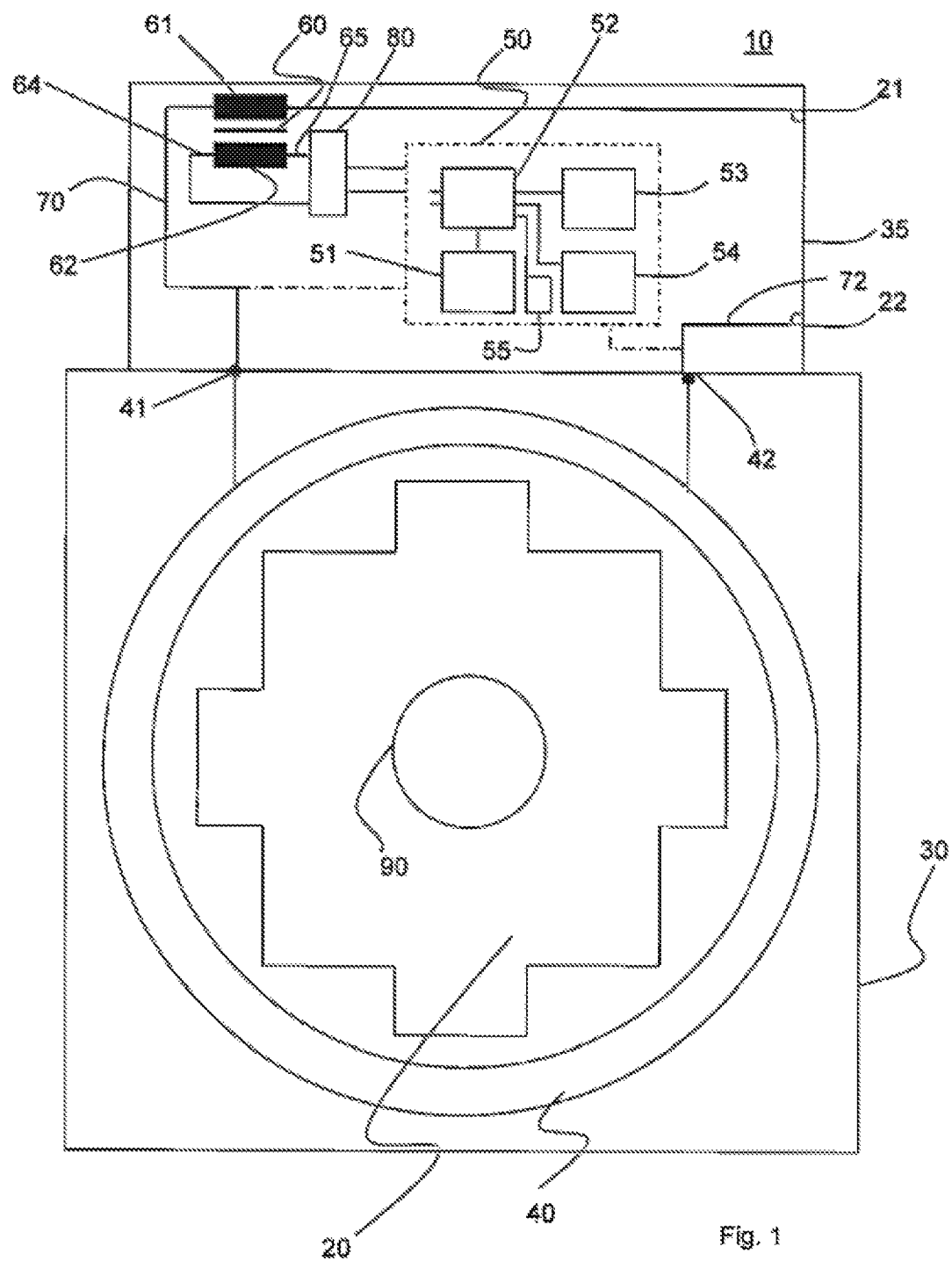
FIG. 1 is a schematic front view of an inductive current transformer according to the invention, wherein the front housing wall has been removed.

FIG. 1 illustrates a block diagram of an exemplary inductive current transformer 10 which is implemented as a plug-in current transformer, by way of example.

The inductive current transformer 10 is used, inter alia, for transforming a primary electric current to be measured, which can flow through a conductor 90, into a secondary electric current. In the plug-in current transformer 10 shown by way of example, the conductor 90 carrying the primary electric current to be measured forms the primary winding of the inductive current transformer 10. This current conductor 90 extends through a feedthrough opening 20 of the inductive current transformer 10, as indicated in FIG. 1. Inductive current transformer 10 comprises a secondary winding 20 with two terminals 41 and 42, in a manner known per se. The secondary winding 40 may be accommodated in a housing 30. Inductive current transformer 10 furthermore comprises an electronic device 50 or electronic functional module which is adapted for transmitting information to an external measuring device 120, inter alia. Information that can be transmitted preferably include characteristic data, such as for example the primary rated current and the secondary rated current, which are decisive for the transformation ratio of the inductive current transformer 10, adjustment parameters, the serial number for identifying the inductive current transformer 10. The characteristic data may be stored in a memory 55.

The electronic device 50 may be accommodated in a head portion of inductive current transformer 10, which may be disposed in a separate housing 35. The head portion may be configured as a pluggable module in order to be detachably secured to the housing 30. Alternatively, the housing 35 of the head portion may as well be glued to the housing 30 during assembly, or may otherwise be connected thereto in a non-detachable manner.

The inductive current transformer 10 comprises a first inductive coupling device 60 connected to the secondary winding 40. Furthermore, the inductive current transformer 10 comprises a power supply device 80 which is coupled to the secondary winding 40 via the first inductive coupling device 60 and is adapted to generate a supply voltage for the electronic device 50 from the secondary electric current of the secondary winding 40.

In the example shown, terminals 41 and 42 of the secondary winding 40 are connected to an internal connecting conductor 70 and an internal connecting conductor 72, respectively. The electrical connection between terminals 41 and 42 and connecting conductors 70 and 72 is established when assembling housing 35 and housing 30. Connecting conductor 72 is connected to an output connection or output terminal 22 of the inductive current transformer 10.

Advantageously, the first inductive coupling device 60 is implemented as a current transformer having a first winding 61 and a second winding 62, wherein one of the two connecting conductors, in the present example connecting conductor 70, forms the first winding of the coupling device 60, and the second winding 62 is connected to the internal power supply device 80 via terminals 64 and 65.

It should be noted that the first inductive coupling device 60 shown in FIG. 1 is connected in series with the secondary winding 40, since the connecting conductor 70 forms the first winding 61 of coupling device 60 that is implemented as a current transformer. Such interconnection is advantageous because the secondary current of the secondary winding 40, which corresponds to the primary electric current to be measured, must not be corrupted. In this implementation, the secondary current of secondary winding 40 flows through the inductive coupling device 60 which supplies a voltage at the terminals 64 and 65 of second winding 62, which is converted into a DC voltage, by power supply device 80, for feeding the electronic device 50 or the components thereof. For example, the voltage of the second winding 62 provided at terminals 64 and 65 is converted into a DC voltage of about 3.3 V by power supply device 80. Connecting conductor 70 is connected to a terminal or connection terminal 21 of the inductive current transformer 10.

By tapping the energy in connecting conductor 70, part of the apparent power provided by the inductive current transformer 10 is used; the secondary current of the secondary winding 40, which represents the measurement signal, is therefore essentially not altered. It should be noted that power is supplied in this way only when a primary current sufficiently large to power the electronic device 50 flows through the conductor 90, i.e. through the primary winding of the inductive current transformer 10. Such a restriction can be accepted in principle, since the transmission of information, preferably of the characteristic data of the inductive current transformer, is not time-critical, and since other data such as measurement or temperature data will only occur during operation.

Figure 2:
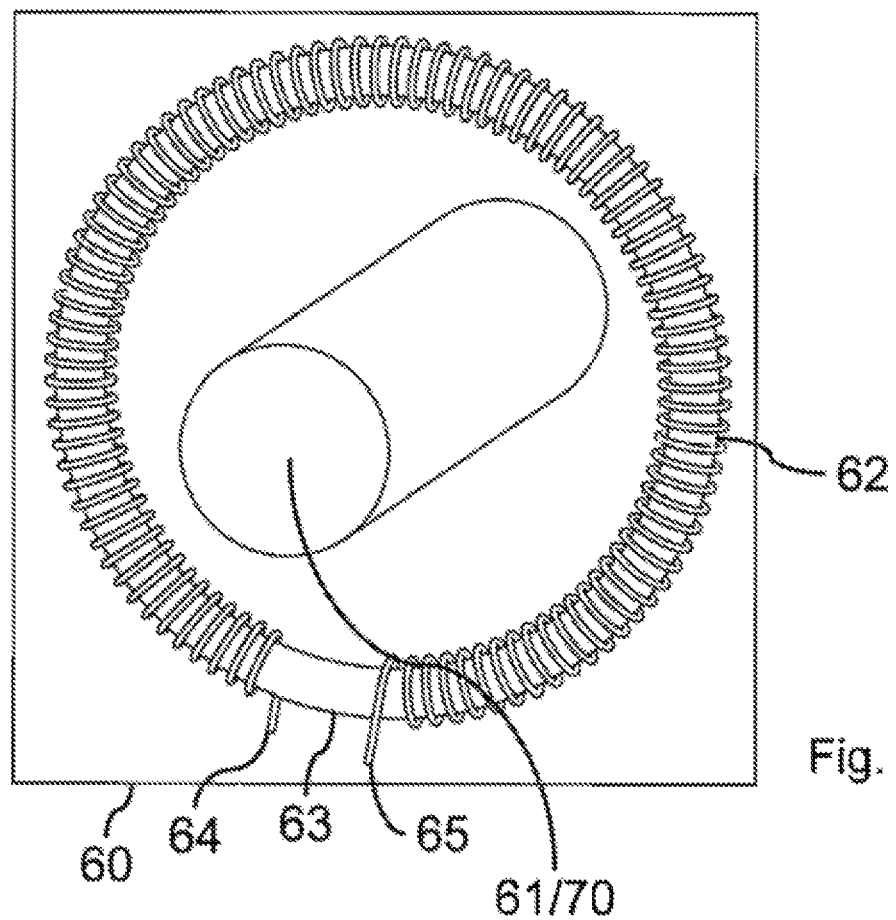
FIG. 2 shows an exemplary embodiment of the inductive coupling device shown in FIG. 1.

The first inductive coupling device 60 which is implemented as a current transformer by way of example, is shown in more detail in FIG. 2. FIG. 2 shows the first winding 61 of coupling device 60, which is formed by connecting conductor 70. The second winding 62 is preferably formed by a toroidal coil consisting of a wire wound around an annular support 63 or toroidal core. FIG. 2 furthermore shows the two terminals 64 and 65 of second winding 62.

In order to be able to transmit information, such as the characteristic data stored in memory 55, the electronic device 50 may be adapted to selectively modulate the secondary current of secondary winding 40. For this purpose, electronic device 50 may include a transmitter 52 implemented as a microcontroller, for example. Microcontroller 52 can access the memory 55, inter alia, which stores the characteristic data of the inductive current transformer 10, for example. Microcontroller 52 may also be adapted to cyclically modulate the characteristic data stored in memory 55 to the secondary current flowing in connecting conductor 70 as soon as an operating voltage is provided by energy supply device 80. As a communication protocol, a digital serial interface may be used, for example, such as the Universal Asynchronous Receiver Transmitter (UART) interface. Electronic device 50 may furthermore comprise a temperature sensor 51 which is capable of monitoring the ambient temperature or the temperature of the inductive current transformer 10. The measured temperature values determined by the temperature sensor 51 may likewise be transmitted by the electronic device 50, in particular by microcontroller 52, through modulation of the secondary current, to an external measuring device 120 shown in FIG. 5.

Electronic device 50 may furthermore comprise a measuring device 53 for measuring a secondary voltage applied to the terminals 41 and 42 of secondary winding 40, a measuring device for measuring the secondary current, and a device for calculating the power as a function of the secondary current and of the secondary voltage. The calculating of the electrical power as a function of the secondary current and secondary voltage can be performed in microcontroller 52.

Electronic device 50, in particular microcontroller 52, may be adapted to detect, in response to a calculated power, the exceeding of a predetermined rated power known to the microcontroller 52, and to signal this condition to an external measuring device through a modulation of the secondary current. It makes sense to notify the measuring device 120 of the exceeding of the predefined rated power, since in this case the measurement signal will be corrupted and the measurement result will be determined incorrectly.

Some exemplary embodiments for modulating the secondary current of secondary winding 40 will now be described.

One option is that the electronic device 50 and in particular the microcontroller 52 have separate terminals for connection to the terminals 64 and 65 of the second winding 62 of inductive coupling device 60. The separate terminals and the terminals for connecting the microcontroller to power supply device 80 are symbolically represented by two lines in FIG. 1. As soon as the electronic device 50 desires to transmit data to a measuring device, the microcontroller 52 drives a signaling current through the second winding 62 thereby modulating the secondary current in connecting conductor 70 in accordance with the data to be transmitted.

Figure 3:
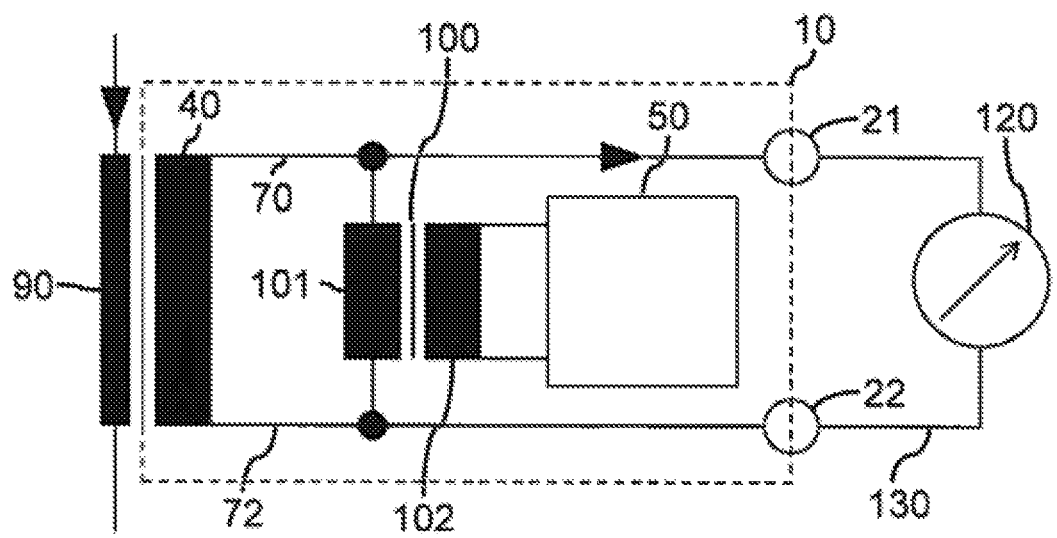
FIG. 3 shows an inductive coupling device for modulating the secondary current.

FIG. 3 illustrates an alternative modulation device of inductive current transformer 10. As shown in FIG. 3, the electronic device 50 is coupled to secondary winding 40 via a second inductive coupling device 100 which is connected in parallel to secondary winding 40, in order to be able to selectively modulate the secondary current. Second inductive coupling device 100 has a first winding 101 which is connected in parallel to secondary winding 40. Furthermore, it has a second winding 102 which is connected to electronic device 50, or microcontroller 52. Moreover, FIG. 3 schematically shows the conductor 90 or the primary winding 90 which carries the primary current to be measured. Furthermore, connection terminals 21 and 22 are shown, to which the measuring device 120 shown in FIG. 5 is connected via connection lines 130.

Figure 4:
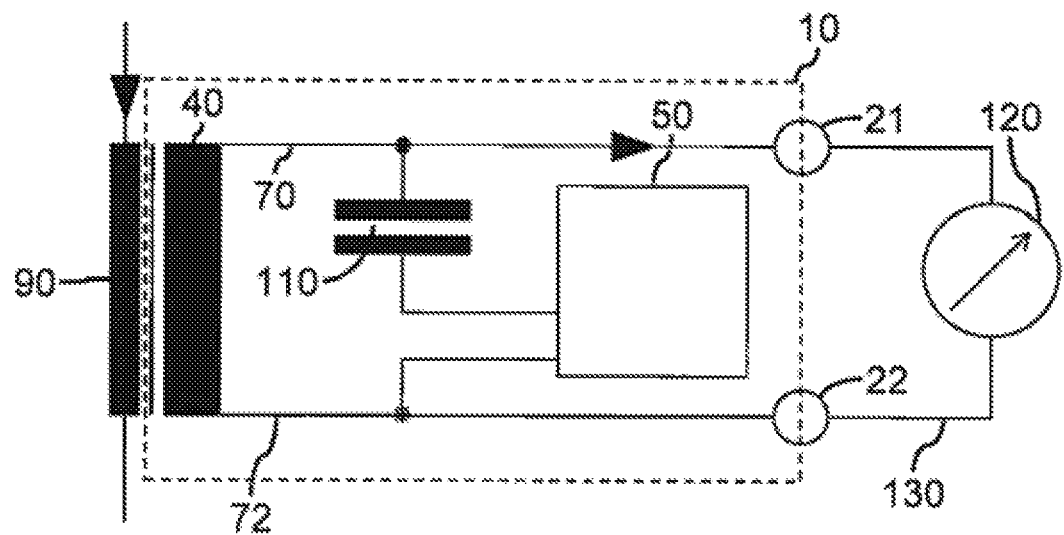
FIG. 4 shows a capacitive coupling device for modulating the secondary current.

An alternative modulation device is shown in FIG. 4. In this case, a capacitive coupling device 110 is used for coupling the electronic device 50 to the secondary winding 40, for example in the form of a capacitor. The electronic device 50, or microcontroller, is configured for altering the capacitance in capacitor 110 in the rhythm of the data to be transmitted, thereby modulating the secondary current.

It should be noted that the carrier frequency of the data signal conveying the information should be well above the harmonics of the secondary measurement current, so that the secondary current measurement signal is not corrupted by the data signal.

Figure 5:
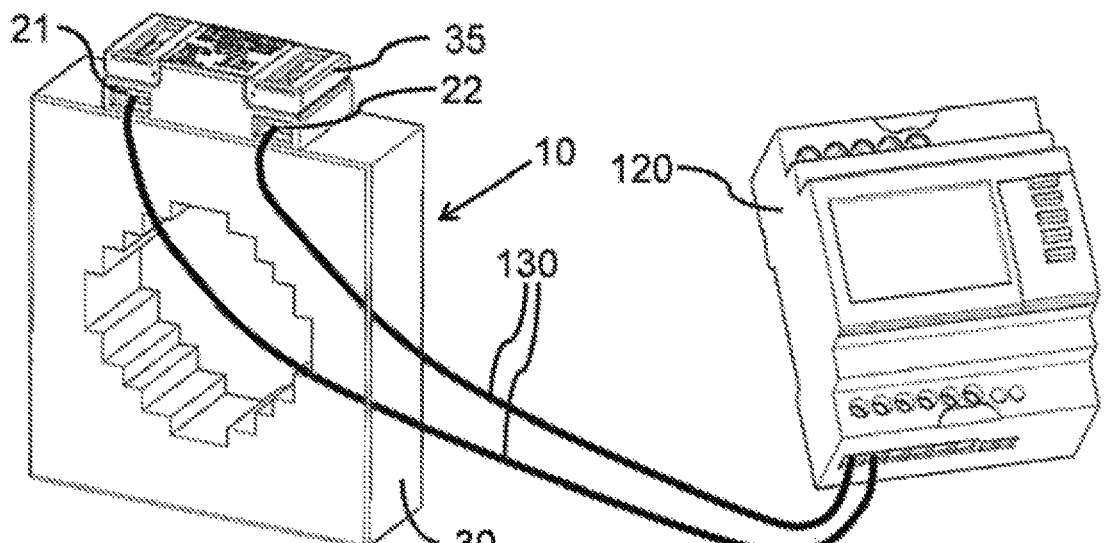
FIG. 5 shows an exemplary measuring arrangement comprising the inductive current transformer of FIG. 1.

FIG. 5 illustrates an exemplary measuring arrangement comprising, by way of example, the inductive current transformer 10 of FIG. 1 and the measuring device 120 already mentioned above, which is connected to the inductive current transformer 10 via connection line 130. The two-wire connection line 130 is connected to connection terminals 21 and 22 of inductive current transformer 10.

Measuring device 120 comprises a demodulation and evaluation device in order to be able to demodulate and evaluate the modulated secondary current received via connection line 130.

LIST OF REFERENCE NUMERALS

10 Inductive current transformer
20 Feedthrough opening
21, 22 Output connection, e.g. connection terminal
30, 35 Housing
40 Secondary winding
41, 42 Terminal
50 Electronic device
51 Temperature sensor
52 Control unit, e.g. microcontroller
53 Voltage measuring device
54 Current measuring device
55 Memory, in particular for characteristic data
60 First inductive coupling device, e.g. current transformer
61 First winding
62 Second winding
64, 65 Terminal
70, 72 Connecting conductor
80 Power supply device
90 Primary winding
100 Second inductive coupling device
101 First winding
102 Second winding
110 Capacitive coupling device
120 Measuring device
130 Connection line

The invention claimed is:

1. An inductive current transformer for transforming a primary electric current to be measured into a secondary electric current, the inductive current transformer comprising:
    a secondary winding with two terminals;
    an electronic device adapted to transmit information to an external measuring device, wherein the external measuring device is connectable to the inductive current transformer via a connection line, wherein the electronic device comprises a memory which can store characteristic data of the inductive current transformer, wherein said characteristic data are to be transmitted to the external measuring device, and wherein the electronic device is configured to selectively modulate the secondary current of the secondary winding in order to be able to transmit information to the external measuring device;
    a first inductive coupling device connected to the secondary winding;
    a power supply device which is coupled to the secondary winding via the first inductive coupling device and is adapted to generate a supply voltage for the electronic device from the secondary electric current of the secondary winding; and
    two connecting conductors each one connected to a respective one of the terminals of the secondary winding and to a respective one of two output terminals of the inductive current transformer, wherein the connection line is connectable to the output terminals.

2. The inductive current transformer as claimed in claim 1, wherein the first inductive coupling device is implemented as a current transformer having a first winding and a second winding, wherein one of the connecting conductors forms the first winding of the current transformer and the second winding is connected to the power supply device.

3. The inductive current transformer as claimed in claim 1, wherein the electronic device is coupled to the secondary winding via the first inductive coupling device, via a second inductive coupling device, or via a capacitive coupling device in order to be able to selectively modulate the secondary current.

4. The inductive current transformer as claimed in claim 1, wherein the electronic device comprises a measuring device for measuring the secondary current, a measuring device for measuring a secondary voltage applied to the terminals of the secondary winding, and a device for calculating an electrical power as a function of the secondary current and of the secondary voltage.

5. The inductive current transformer as claimed in claim 4, wherein the electronic device is adapted to detect, in response to a calculated electrical power, an exceeding of a predefined rated power and to signal this condition to the external measuring device through a modulation of the secondary current.

6. The inductive current transformer as claimed in claim 1, wherein the electronic device comprises a temperature sensor; and wherein the electronic device is adapted to transmit temperature values determined by the temperature sensor to the external measuring device through a modulation of the secondary current.

7. The inductive current transformer as claimed in claim 1, wherein the inductive current transformer is a plug-in transformer.

8. A measuring arrangement, comprising:
an external measuring device; and
an inductive current transformer for transforming a primary electric current to be measured into a secondary electric current, the inductive current transformer comprising:
a secondary winding with two terminals;
an electronic device adapted to transmit information to the external measuring device, wherein the external measuring device is connected to the inductive current transformer via a connection line, wherein the electronic device comprises a memory which can store characteristic data of the inductive current transformer, wherein said characteristic data are to be transmitted to the external measuring device, and wherein the electronic device is configured to selectively modulate the secondary current of the secondary winding in order to be able to transmit information to the external measuring device;
a first inductive coupling device connected to the secondary winding;
a power supply device which is coupled to the secondary winding via the first inductive coupling device and is adapted to generate a supply voltage for the electronic device from the secondary electric current of the secondary winding; and
two connecting conductors each one connected to a respective one of the terminals of the secondary winding and to a respective one of two output terminals of the inductive current transformer, wherein the connection line is connectable to the output terminals.

9. The measuring arrangement as claimed in claim 8, wherein the external measuring device is adapted for demodulating and evaluating a secondary current modulated by the inductive current transformer.

* * * * *